(12) United States Patent
Yamane et al.

(10) Patent No.: US 6,215,679 B1
(45) Date of Patent: Apr. 10, 2001

(54) ALTERNATOR POWER CONVERTER

(75) Inventors: Toshinori Yamane; Hirotoshi Maekawa, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/576,200

(22) Filed: May 23, 2000

(30) Foreign Application Priority Data

Dec. 27, 1999 (JP) .................................................. 11-370478

(51) Int. Cl.$^7$ ................................................ H02M 7/5387
(52) U.S. Cl. ................................................ 363/132; 363/39
(58) Field of Search .................................... 363/131, 132, 363/95, 98, 16, 17, 39

(56) References Cited

U.S. PATENT DOCUMENTS

| | | | |
|---|---|---|---|
| 5,615,102 | * | 3/1997 | Daijo ..................................... 363/132 |
| 5,729,450 | * | 3/1998 | Dimino et al. ........................ 363/132 |
| 5,757,636 | * | 5/1998 | Fletcher .................................. 363/98 |
| 5,835,371 | * | 11/1998 | Kume et al. ........................... 363/132 |

FOREIGN PATENT DOCUMENTS 10-304680    11/1998    (JP) ................................. H02M/7/48

* cited by examiner

*Primary Examiner*—Adolf Deneke Berhane
(74) *Attorney, Agent, or Firm*—Sughrue, Mion, Zinn, Macpeak & Seas, PLLC

(57) ABSTRACT

The present invention provides an alternator having a small size and a high reliability wherein, the alternator is equipped with a switching power module 1 having a resin case 13 housing switching elements 2 and a driving circuit section 5, a smoothing capacitor 7 for smoothing a direct current output supplied to the switching elements 2, a control circuit section 6 for outputting a control signal to the driving circuit section 5 and a cooling member 24; a ceramic capacitor is used as the smoothing capacitor; a smoothing capacitor board 25 for mounting the smoothing capacitor 7 is disposed between an insulating board mounting with the switching elements 2 and a driving circuit board 18 mounting with the driving circuit section 5; and the smoothing capacitor board 25 functions also as an electromagnetic shielding plate for protecting the driving circuit section 5 against the switching noise of the switching elements.

3 Claims, 10 Drawing Sheets

ALTERNATOR POWER CONVERTER

BACKGROUND OF THE INVENTION

1. Field of the Invention

The present invention relates to an alternator such as an inverter and the like, and in particular, to the type, positioning, mounting, fixing, connecting method and the like of a smoothing capacitor used in the alternator.

2. Description of the Related Art

FIG. 12 is a block diagram showing the circuit construction of a conventional alternator which converts a DC power source into a three phase alternating current for driving an AC load such as a three-phase AC motor. Taking the case of an electric vehicle as an example, when the vehicle is first started off or accelerated, a switching power module 1 converts the discharge output of a DC power source 8 (battery) from direct current to a three phase current to drive an AC load 9 (three-phase motor). On the other hand, when the vehicle performs regenerative braking, regenerative power from the AC load 9 (three-phase motor) is converted from three phase current to direct current and returned to the DC power source 8 (battery).

Switching elements 2 such as transistors which convert power from direct current to three phase current, i.e, IGBT (Insulated Gate Bipolar Transistor) and MOSFET (Metal Oxide Semiconductor Field Effect Transistor), free-wheel diodes 3 which convert power from three phase current to direct current, snubber capacitors 4 for suppressing a surge voltage occurring in the switching elements 2 section during switching, and a drive circuit section 5 for driving the switching elements 2 are loaded in the switching power module 1.

Here, the main property demanded of the snubber capacitor 4 is good frequency characteristics. Thus, a film capacitor is generally used as the snubber capacitor 4. On the other hand, a smoothing capacitor 107 suppresses voltage fluctuation of the DC power source 8 during switching and smoothes a voltage jump and the like, and thus must have a sufficiently large capacitance. Therefore, an aluminum electrolytic capacitor which can easily provide a large capacitance is generally used as the smoothing capacitor 107.

Furthermore, a control circuit section 6 outputs a control signal to the drive circuit section 5 in the switching power module 1 to control the switching elements 2. Moreover, since the drive circuit section 5 and control circuit section 6 are generally circuits for driving and controlling the AC load 9, i.e., three phase motor and the like, detailed drawings thereof are omitted.

Moreover, FIG. 13 is a partially sectional side elevation view showing the internal construction of a common conventional alternator. In FIG. 13, a switching power module 1, smoothing capacitors 107, a snubber capacitor board 20 loaded with snubber capacitors 4 (not shown), and a control circuit board 19 loaded with control circuits 6 (not shown) are housed in a case 23.

Generally, a distributing board 21 such as a copper bus bar or a copper plate and the like is used for connecting the switching power module 1 and the smoothing capacitors 107 which are electrically connected when the distributing board 21 is connected with screws 22. Also, the snubber capacitor board 20 is generally arranged in the vicinity of a positive electrode (P), negative electrode (N) DC input wiring 10*p*, 10*n* and a U phase, V phase and W phase AC output wiring 11 of the switching power module 1, and is at the same time fixed and electrically connected with the screws 22.

The switching power module 1 package is constructed from: a resin switching power module case 13 insert molded with the positive electrode (P), negative electrode (N) DC input wiring 10*p*, 10*n*, the U phase, V phase and W phase AC output wiring 11 and driving circuit board connection wiring 12; and a switching power module base board 14. Also, an insulating board 15, such as a ceramic board and the like, loaded with switching elements 2 and free-wheel diodes 3, and a driving circuit board 18 (not shown) loaded with the driving circuit section 5 are housed in the switching power module 1 package.

The switching elements 2 and free-wheel diodes 3 are fixed with a bonding member, such as solder and the like, on the switching power module base board 14 via the insulating board 15 which has a conductor pattern. The switching elements 2 and free-wheel diodes 3 are connected with the positive electrode (P), negative electrode (N) DC input wiring 10*p*, 10*n*, the U phase, V phase and W phase AC output wiring 11 and the driving circuit board connection wiring 12 by means of a connecting conductor 16 such as wire bonding and the like. Moreover, the driving circuit board 18 and the driving circuit board connection wiring 12 are electrically connected with solder and the like.

A gel filler 17 is filled between the insulating board 15 and the driving circuit board 18, and there are also cases where a resin, such as an epoxy and the like, is further filled thereon. Moreover, this gel filler 17 protects the switching elements 2, free-wheel diodes 3 and connecting conductor 16 so as to prevent the switching elements from being damaged or malfunctioning due to dust and humidity.

The surface of the driving circuit board 18 on the insulating board 15 side is generally beta grounded to obtain an electromagnetic sealed effect so that the driving circuit section 5 does not malfunction due to switching noise generated from the switching elements 2 during power conversion.

Furthermore, a cooling member 24 for cooling the switching elements 2 by means of air-cooling, water-cooling, oil-cooling and the like is attached to the case 23, and Joule heat generated from the switching elements 2 is dissipated to cooling member 24 via the insulating board 15 and the switching power module base board 14. Thus, the switching elements are cooled. Moreover, detailed drawings of the mounting position and fixing method of a control circuit board have been omitted.

The smoothing capacitor 107 must have a sufficiently large electrostatic capacity because it smoothes the power of the DC power source to be supplied to the switching elements 2. Accordingly, it generally has a large size. When an aluminum electrolytic capacitor is used as the smoothing capacitor 107, since the internal resistance thereof is high, the internally generated heat of the smoothing capacitor 107 is increased by ripple voltage fluctuation of the direct current which occurs during switching.

In order to suppress this generated heat, the structure of the switching power module 1 must be complicated by cooling the smoothing capacitor 107 with the cooling member 24, or the electrostatic capacity must be increased further. Accordingly, conventional alternators have had a drawback in that the surface area and volume of the smoothing capacitor 107 are large, thus increasing the size of the entire apparatus.

Also, aluminum electrolytic capacitors have drawbacks in that they have a narrow operating temperature range, and a short service life due to electrolyte leakage which accompanies poor sealing.

Furthermore, since the surface area and volume of the smoothing capacitor 107 are large, there is a drawback in that electrical wiring for connecting the switching power module 1 and smoothing capacitor 107 must be long. Hence, the wiring inductance between the switching elements 2 and the smoothing capacitor 107 increases, and because there is a danger that the switching elements 2 will be damaged by a large surge voltage occurring during switching, snubber capacitors 4 must be provided in the vicinity of the positive electrode (P), negative electrode (N) DC input wiring 10$p$, 10$n$ and a U phase, V phase and W phase AC output wiring 11 of the switching power module 1.

Moreover, in the conventional switching power module 1, the surface of the driving circuit board 18 on the switching elements 2 side is magnetically sealed by means of a beta grounding method and the like so as to prevent malfunctioning of the driving circuit section 5 due to radiant noise generated from the switching elements 2, hence there is a constraint in that components can only be mounted on one side of the driving circuit board 18.

SUMMARY OF THE INVENTION

The present invention aims to solve the above mentioned problems and an object of the present invention is to provide small highly reliable alternator.

According to one aspect of the present invention there is provided an alternator for converting direct current to alternating current equipped with: a switching power module having a switching element for converting power by switching, a driving circuit section for driving the switching element and a resin case for housing the switching element; a smoothing capacitor for smoothing power output of a DC power source supplied to the switching element; a control circuit section for outputting a control signal to the driving circuit section for control operation of the switching element; and a cooling member for cooling the switching element, wherein, a ceramic capacitor is used as the smoothing capacitor and a smoothing capacitor board for mounting the smoothing capacitor is provided in the switching power module between an insulating board for mounting the switching element and a driving circuit board for mounting the driving circuit section, and the smoothing capacitor board functions also as an electromagnetic shielding plate for protecting the driving circuit section against switching noise from the switching element.

According to another aspect of the present invention, the smoothing capacitor and smoothing capacitor board are electrically connected via a smoothing capacitor mounting member having a flexible lead portion.

According to yet another aspect of the present invention, the smoothing capacitor is fixed to the smoothing capacitor board by means of a smoothing capacitor fixing member made of a material with good heat conducting properties.

DETAILED DESCRIPTION OF THE PREFERRED EMBODIMENTS

Embodiment 1

Figure 1:
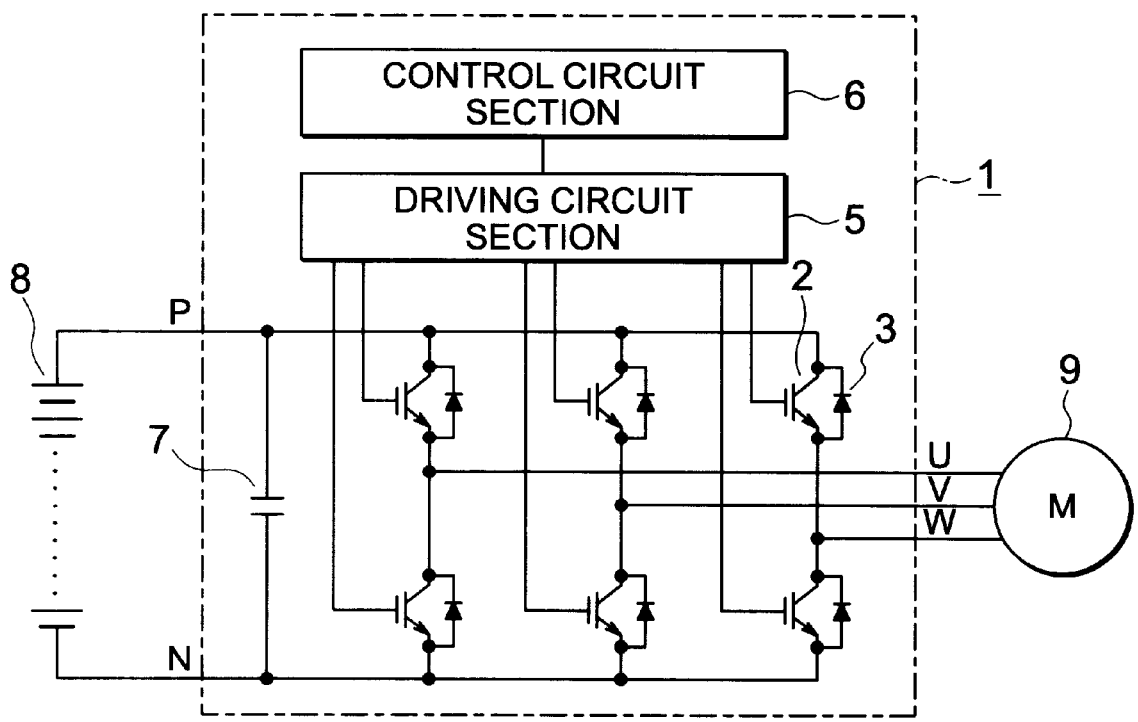
FIG. 1 is a block diagram of a circuit construction of an alternator according to Embodiment 1 of the present invention.

Next, a preferred embodiment of the present invention will be explained with reference to the drawings. Although the following explanation describes the case where an inverter is used for driving a three-phase motor and the like, the present invention may be applied any type of alternator. Moreover, similar reference numerals will be used for elements similar to those in the previously mentioned conventional art and the repeat description there of will be omitted.

Figure 12:
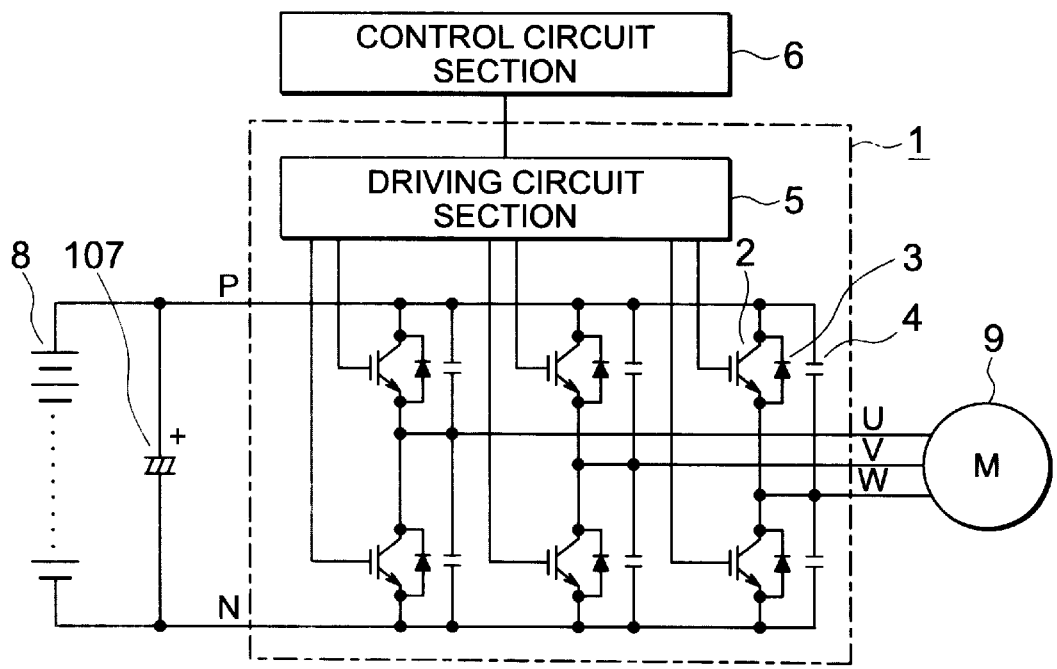
FIG. 12 is a block diagram showing the circuit construction of a conventional alternator.
Figure 13:
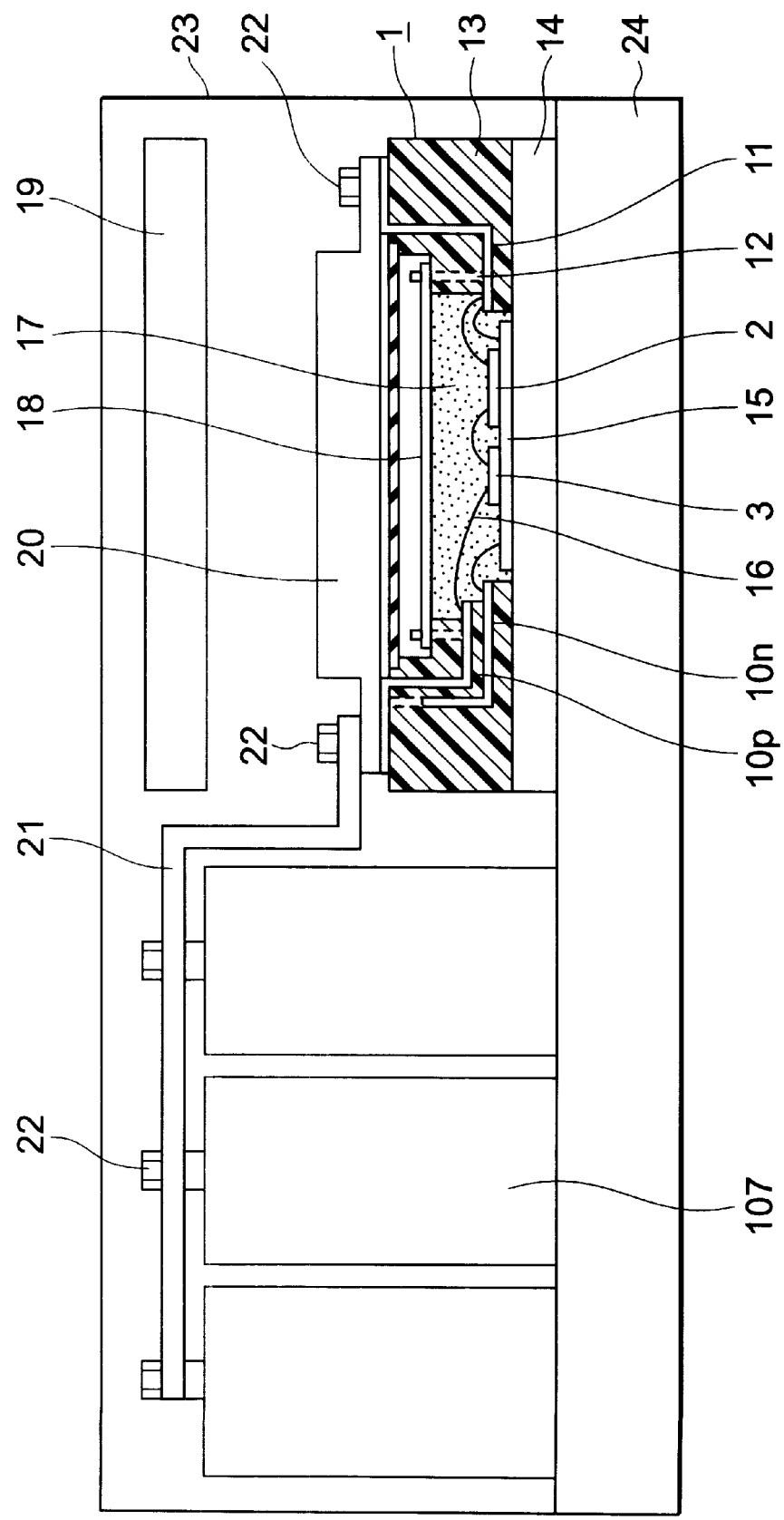
FIG. 13 is a partially sectional side elevational view showing the internal construction of a common conventional alternator.

FIG. 1 is a block diagram of a circuit construction of an alternator according to Embodiment 1 of the present invention. Contrary to the conventional example shown in FIG. 12, in the circuit construction of FIG. 1. a smoothing capacitor 7 is changed from an aluminum electrolytic capacitor to a ceramic capacitor, the smoothing capacitor 7 is loaded in a power switching module 1, a snubber capacitor 4 is deleted, and further, a control circuit section 6 is loaded in the switching power module 1.

Figure 2:
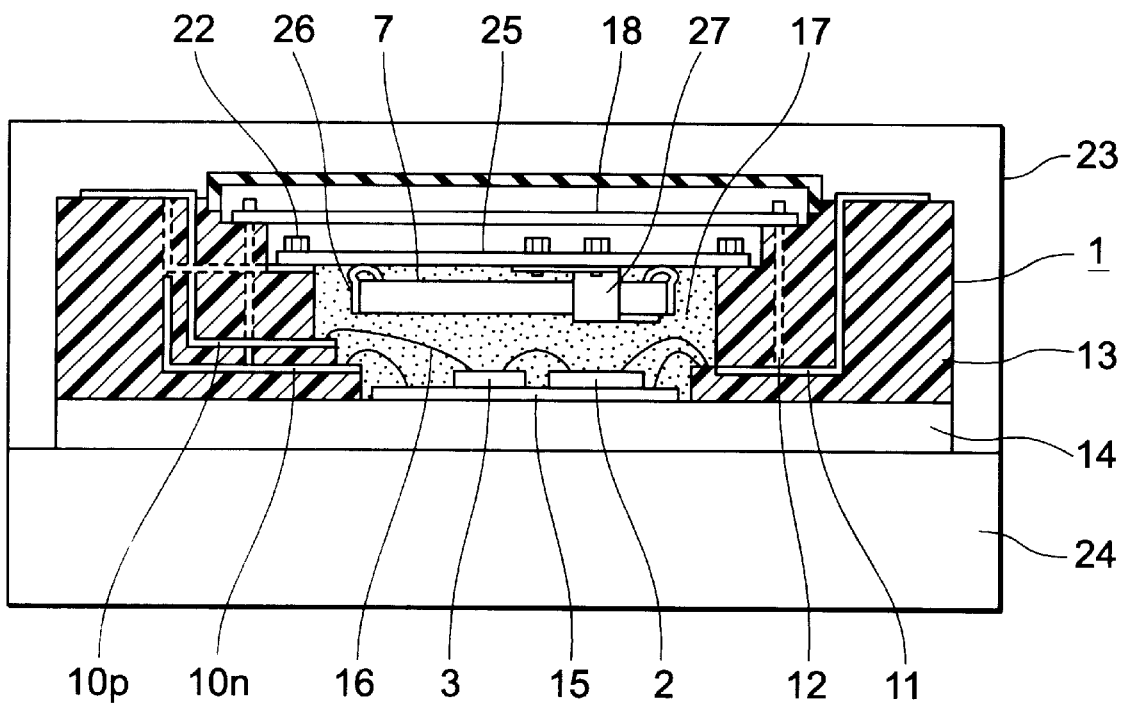
FIG. 2 is a partially sectional side elevational view of a circuit construction of an alternator according to Embodiment 1 of the present invention.

FIG. 2 is a partially sectional side elevational view of a circuit construction of an alternator according to Embodiment 1 of the present invention. Contrary to the conventional example shown in FIG. 12, in FIG. 2, screws 22 and a distributing board 21 connecting a conventional switching power module 1 and smoothing capacitor 7 are deleted, and a snubber capacitor board 20 is also eliminated.

On the other hand, a smoothing capacitor board 25 for mounting the smoothing capacitor 7 and which also functions as an electromagnetic shielding plate is added in the switching power module 1. Furthermore, since a control circuit section 6 is mounted together with a driving circuit section 5 on both sides of a driving circuit board 18 to be integrated as an alternator control board, the control circuit board 19 of the conventional example is unnecessary.

A general-purpose ceramic capacitor for surface mounting is used as the smoothing capacitor 7. A plurality of ceramic capacitors are linearly connected in order to ensure a capacitance necessary for smoothing a DC power source. The plurality of ceramic capacitors is mounted at an insulating board 15-side surface of the smoothing capacitor board 25.

Ceramic capacitors have an internal resistance and inductance that is about one-tenth that of aluminum electrolytic capacitors. This is what enables the capacitance to be decreased by such a large degree compared to conventional aluminum electrolytic capacitors. Also, since a solid dielectric is used, there is no danger of electrolyte leakage accompanying poor sealing, and hence, the service life is long.

Furthermore, conventionally, the internal resistance of aluminum electrolytic capacitors is large and thus capacitance had to be increased in order to suppress generated heat in the capacitor itself. However, by using ceramic capacitors, the alternator can be realized with a small size and high reliability.

Moreover, wiring inductance between switching elements 2 and the smoothing capacitor 7 can be decreased by including the smoothing capacitor 7 in the switching power module 1. Furthermore, by using a ceramic capacitor having good frequency characteristics as the smoothing capacitor 7, the snubber capacitor 4 and snubber capacitor board 20, which were conventionally required, can be eliminated because a surge voltage generated during switching can be suppressed in the vicinity of the switching elements 2.

On the other hand, besides ceramic capacitors, film capacitors also have a small internal resistance and good frequency characteristics, and use a solid dielectric. Nevertheless, film capacitors have a narrow operating temperature range with the upper limit thereof generally being 105° C., where as that of ceramic capacitors is normally 125° C. Thus they are not easily employed in high temperature operating environments such as automotive vehicles and the like.

Also, film capacitors generally have a smaller per unit volume capacitance than ceramic capacitors. Moreover, even if the capacitance is the same, they have a larger size.

Furthermore, an inverter employing a ceramic capacitor is already disclosed in Japanese Patent Laid-open No. 10-304680. However, the present invention is completely different from the conventional example in that the smoothing capacitor board 25 (described later) also serves as an electromagnetic shielding plate, and cooling means (described later) for controlling the heat generated by the smoothing capacitor itself is also included.

Generally, when a component for surface mounting which does not have a lead wire, such as a chip resistor or a ceramic capacitor, is directly mounted on a board, stress occurs at the joint between the component and the board due to thermal stress which is generated by the difference between the coefficients of thermal expansion of the component and the board. In particular, when a large component for surface mounting is directly mounting on the board, a large stress occurs at the joint between the component and the board and there is a high possibility that cracking will develop at the joint to cause contact failure.

Figure 3:
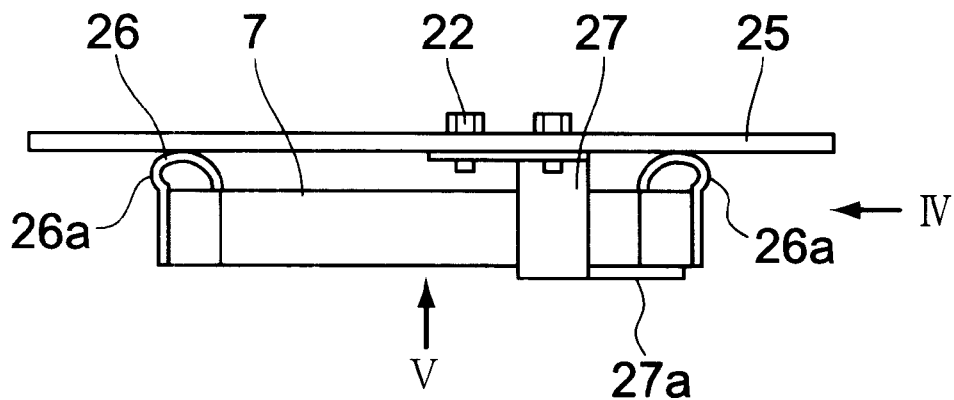
FIG. 3 is a side elevational view showing the mounted state of a snubber capacitor according to Embodiment 1 of the present invention.
Figure 4:
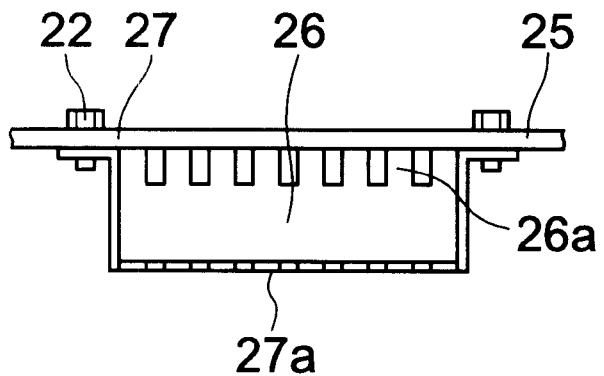
FIG. 4 is a view taken along the direction of the arrow IV in FIG. 3.
Figure 5:
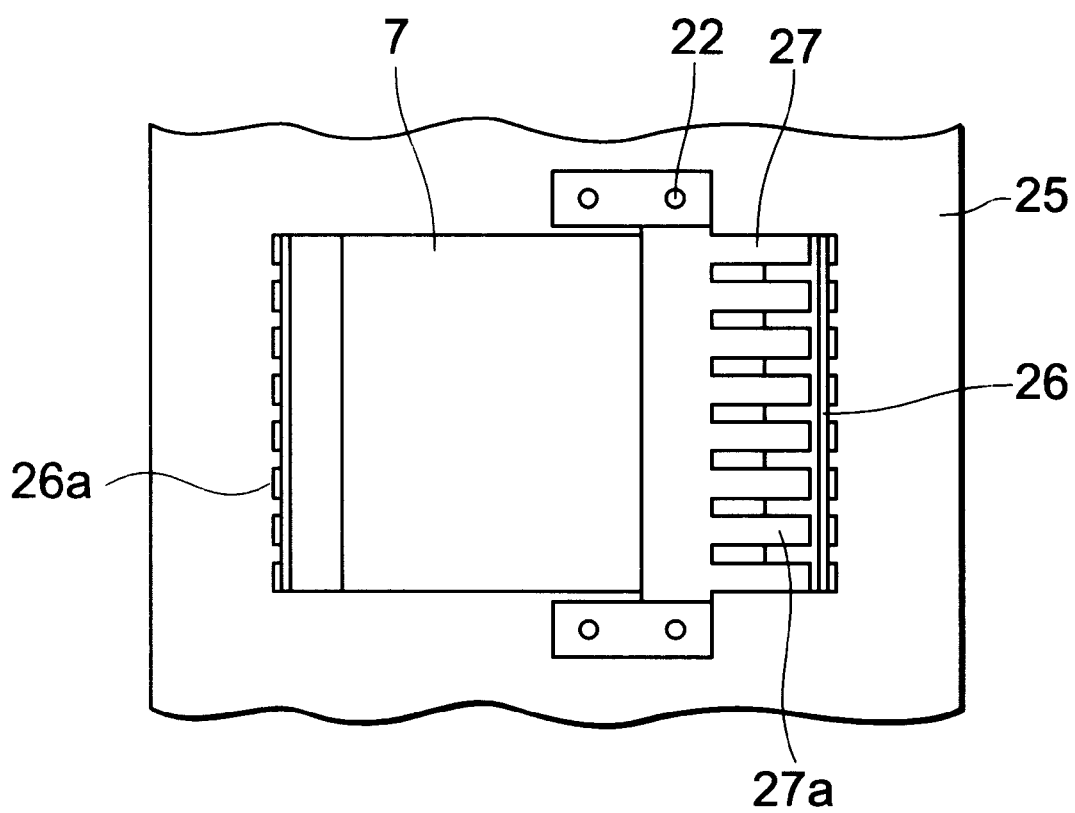
FIG. 5 is a view taken along the direction of the arrow V in FIG. 3.

Thus, in the embodiment of the present invention, when a large ceramic capacitor having a large capacitance is used as the smoothing capacitor 7, as is clearly shown in FIGS. 3 to 5, a smoothing capacitor mounting member 26 is attached to an electrode portion of the ceramic capacitor and the ceramic capacitor is mounted on the smoothing capacitor board 25 in an electrically connected state via the smoothing capacitor mounting member 26.

The smoothing capacitor mounting member 26 has a lead portion 26a formed in a curved shape so as to have flexibility. The contact portion of the lead portion 26a for the smoothing capacitor board 25 is electrically connected by bonding with a bonding member such as solder and the like. Accordingly, thermal stress generated due to the difference between the coefficients of thermal expansion of the ceramic capacitor and smoothing capacitor board 25 is absorbed by the lead portion 26a of the smoothing capacitor mounting member 26. Consequently, there is little possibility that cracking will develop at the joint to cause contact failure.

Figure 6:
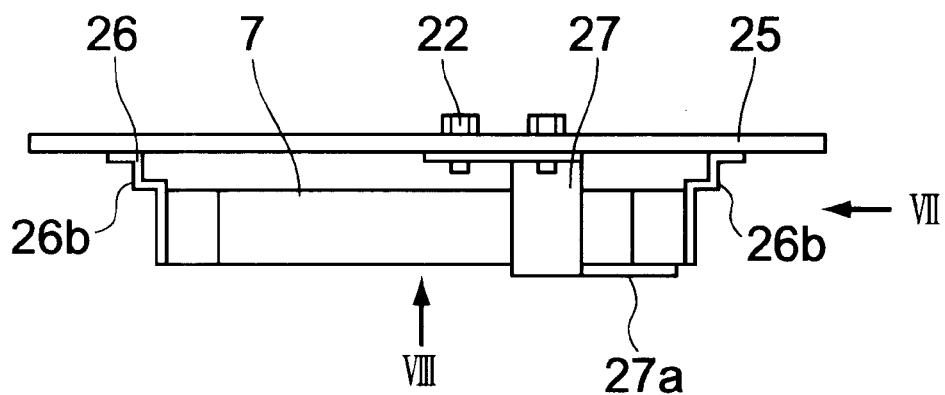
FIG. 6 is a side elevational view showing another configuration a lead potion of a snubber capacitor mounting member.
Figure 7:
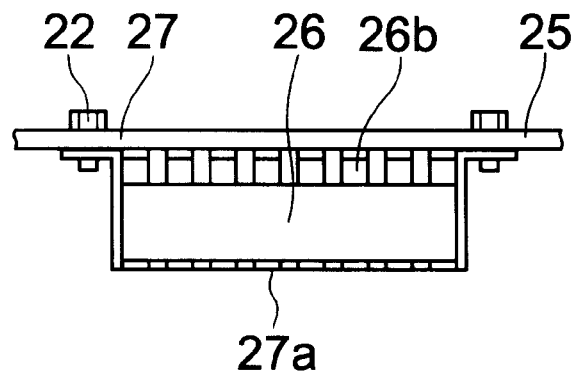
FIG. 7 is a view taken along the direction of the arrow VII in FIG. 6.
Figure 8:
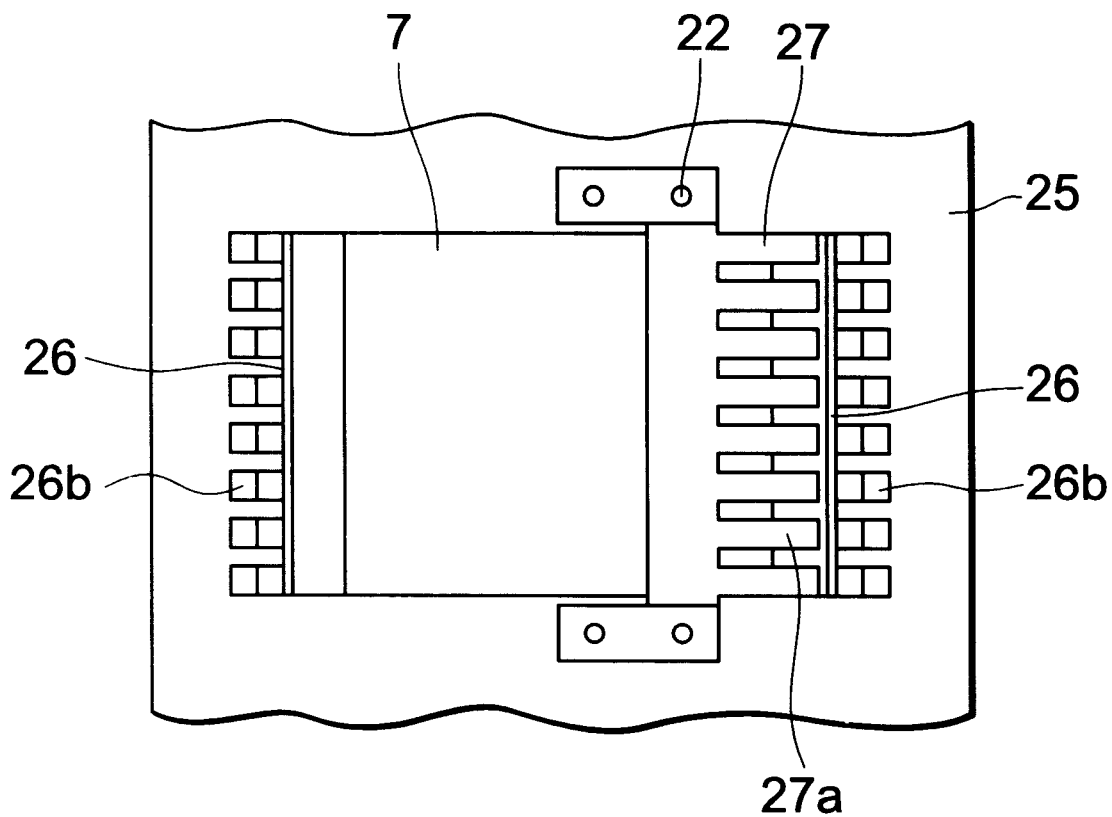
FIG. 8 is a view taken along the direction of the arrow VIII in FIG. 6.
Figure 9:
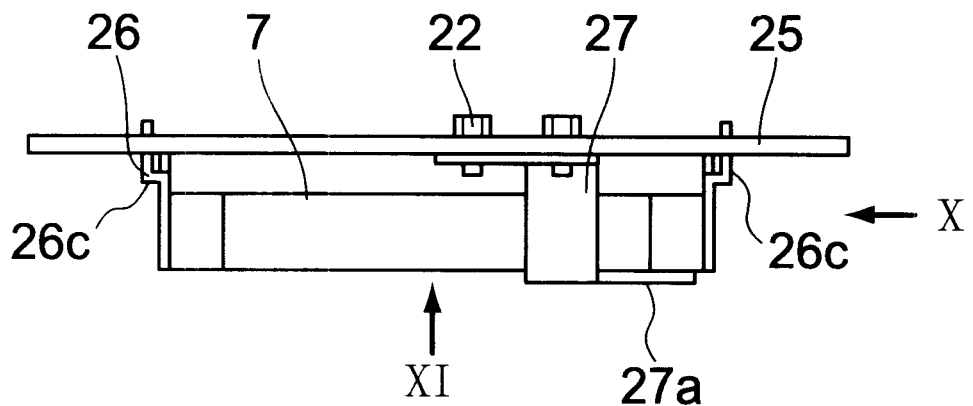
FIG. 9 is a side elevational view showing yet another configuration a lead potion of a snubber capacitor mounting member.
Figure 10:
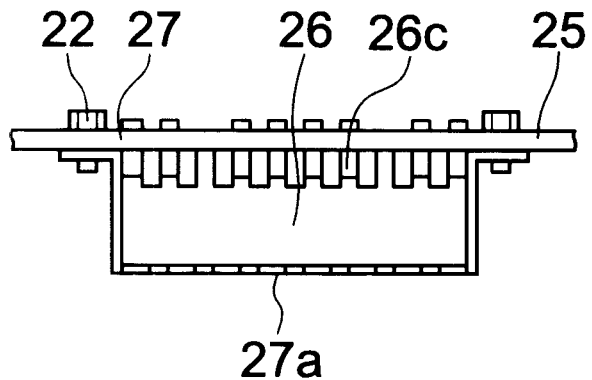
FIG. 10 is a view taken along the direction of the arrow X in FIG. 9.
Figure 11:
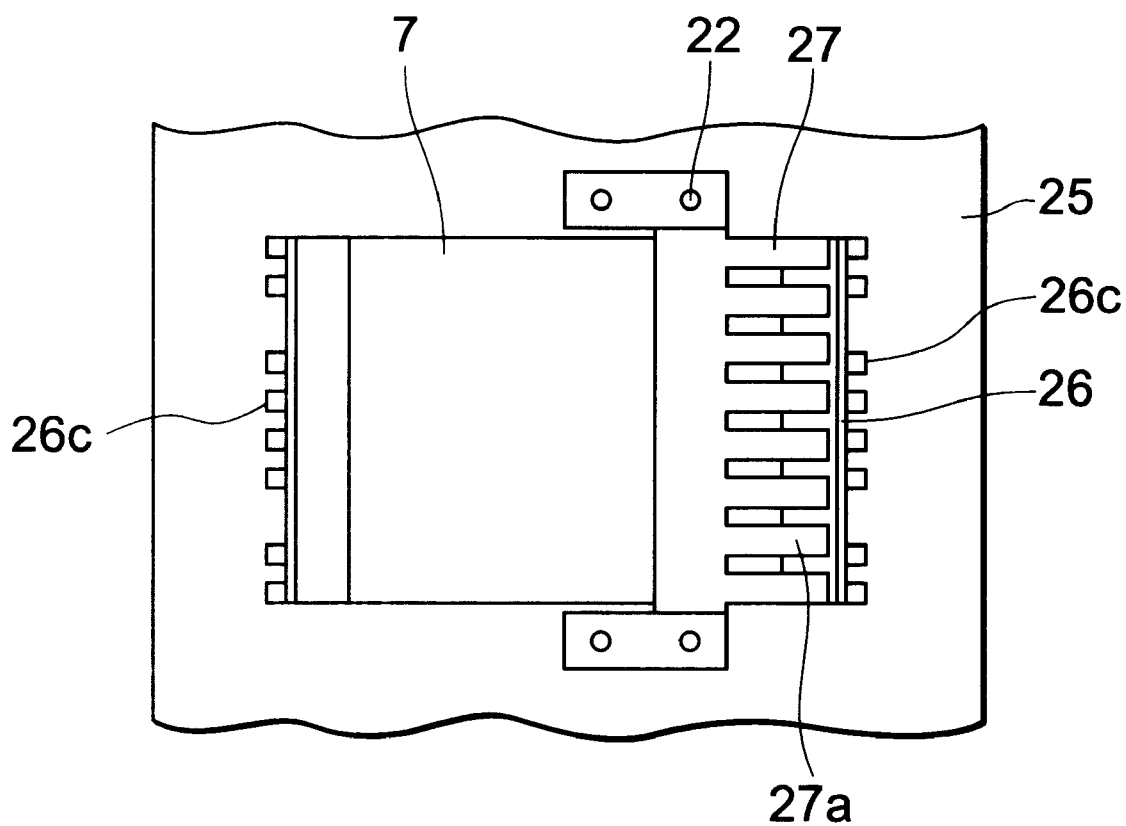
FIG. 11 is a view taken along the direction of the arrow XI in FIG. 9.

Moreover, the lead portion of the smoothing capacitor mounting member 26 may be any shape, such as that of lead portion 26b shown in FIGS. 6 to 8 or lead portion 26c shown in FIGS. 9 to 11, so long as it is capable of absorbing the thermal stress generated by the difference between the coefficients of thermal expansion of the ceramic capacitor and smoothing capacitor board 25.

Also, in the present embodiment, when a large ceramic capacitor having the smoothing capacitor mounting member 26 attached thereto, such as the one described above, is used as the smoothing capacitor 7, the smoothing capacitor 7 is fixed to the smoothing capacitor board 25 using a smoothing capacitor fixing member 27, such as that shown in FIGS. 3 to 5, so that the lead wire portion of the smoothing capacitor mounting member 26 will not become disengaged due to vibration.

The smoothing capacitor fixing member 27 is made of a material with good thermal conduction characteristics so that the generated heat of the smoothing capacitor 7 will be efficiently dissipated. Also, the smoothing capacitor fixing member 27 vents the generated heat of the smoothing capacitor 7 at the smoothing capacitor board 25-side.

The electrode portion smoothing capacitor 7 and the smoothing capacitor fixing member 27 are electrically connected by bonding with a bonding member such as solder and the like. Further, a multi-segmented comb shaped portion 27a is formed at a bonding portion of the smoothing capacitor fixing member 27 to facilitate transfer of the necessary heat during bonding.

The smoothing capacitor fixing member 27 and smoothing capacitor 7 are fixed with screws 22. At the same time, a smoothing capacitor mounting surface of the smoothing capacitor board 25 and a conductive pattern connected to a negative electrode (N) DC input wiring 10n and which is formed on a surface at the other side of the board the are electrically connected with the screws 22. According to the above, the smoothing capacitor fixing member 27 and screws 22 may be efficiently used because they are used to connect the electrode of the smoothing capacitor 7 and the negative electrode (N) DC input wiring 10n.

The smoothing capacitor board 25 mounts the smoothing capacitor 7 which is a ceramic chip capacitor generally used as a component for surface mounting while at the same time serves as an electromagnetic shielding plate which prevents radiant noise generated from the switching elements 2 from being transmitted to the driving circuit section 5.

Specifically, an electromagnetic sealed effect is created by beta grounding over the entire smoothing capacitor 7 mounting surface of the smoothing capacitor board 25 and base surface on the opposite side thereof. The material for smoothing capacitor board 25 may be, for example, a glass epoxy board having copper foil, but any material is acceptable so long as it allows the smoothing capacitor 7 to be mounted and can block switching noise to prevent malfunctioning of the driving circuit section 5.

As is also described in the conventional example, with a conventional switching power module 1 there is a constraint in that components can only be mounted on one surface of the driving circuit board 18 because shielding is performed by a method such as beta grounding the surface of the driving circuit board 18 at the switching elements 2-side to prevent malfunctioning of the driving circuit section 5 due to radiant noise generated from the switching elements 2.

However, in the present invention, the above mentioned constraint is overcome and it becomes possible to mount components on both sides of the driving circuit board 18 by having the smoothing capacitor board 25 function as an electromagnetic shielding plate. Moreover, since not only the driving circuit section 5 but also the control section 6 may be consolidated as an integrated circuit structure, the alternator may have a reduced size and high functionality.

Moreover, with the present invention, dedicated wiring for connecting to the smoothing capacitor board 25 is provided for the positive electrode (P), negative electrode (N) DC input wiring 10p, 10n, and furthermore, the smoothing capacitor board 25 and the positive electrode (P), negative electrode (N) DC input wiring 10p, 10n are connected with screws 22 that also serve to fix the smoothing capacitor board 25. Thus, the connection may be efficient, simple, and reliably made.

When there is a large distance between the DC power source 8 and the alternator due to the way in which the system is organized, or when a regenerative current di/dt of an AC load 9 must be increased, the capacitance of the smoothing capacitor 7 must be further increased. In cases such as these, it is possible to obtain a large capacity smoothing effect by attaching an additional smoothing capacitor to an external lead terminal of the positive electrode (P), negative electrode (N) DC input wiring 10p, 10n in the switching module 1. Here, the smoothing capacitor attached to the external lead terminal of the positive electrode (P), negative electrode (N) DC input wiring 10p, 10n in the switching module 1 is not limited to a ceramic capacitor.

The smoothing capacitor 7 generates heat due to a ripple current which occurs during switching. In the present invention, a ceramic capacitor having a small internal resistance is used as the smoothing capacitor 7. Thus, less heat is generated by the capacitor itself than in the conventional example. Nevertheless, when used in high temperature environments such as automotive vehicles and the like, the operating temperature tolerance is tight. Hence, it is necessary to further increase the capacitance of the smoothing capacitor 7 or perform cooling with some sort of means in order to suppress the self-generated heat.

In the present embodiment, a gel filler 17, filled between the smoothing capacitor board 25 and the insulating board 15 in the switching power module 1 to protect the switching elements 2, free-wheel diode 3 and connecting conductor 16, effectively serves as cooling means. Specifically, the smoothing capacitor 7 is cooled by transferring Joule heat occurring due to the self-generated heat of the smoothing capacitor 7 to the cooling member 24 for cooling the switching elements 2 in the switching power module 1 via the gel filler 17.

In an alternator structured as above, it is possible to reduce the size of the smoothing capacitor because the ceramic capacitor is used as the smoothing capacitor 7 and the smoothing capacitor 7 is also loaded in the switching power module 1. Furthermore, since it is possible to eliminate the distributing board and screws which connected the conventional switching power module 1 and externally connected smoothing capacitor 7, the size of the alternator can be greatly reduced.

Moreover, since it is possible to suppress a surge voltage occurring during switching by loading the smoothing capacitor 7 in the switching power module 1 to reduce the wiring inductance between the switching elements 2 and smoothing capacitor 7, and, by using the ceramic capacitor having good frequency characteristics as the smoothing capacitor 7, it is possible to eliminate the snubber capacitor and snubber capacitor board which were conventionally required.

Further, since a withstand voltage of the switching elements 2 can be lowered, it is possible to reduce the size and lower the cost of the switching elements 2. Alternatively, it is also possible to expand the controllable range of the AC load by setting a high voltage for the DC power source.

Still further, the ability to suppress voltage jump in the DC power source makes it possible to increase the switching speed. Hence, it is possible to reduce loss in the switching elements 2 while setting the carrier frequency high so as to increase controllability and suppress noise during switching.

Furthermore, by using the smoothing capacitor board 25 for mounting the smoothing capacitor 7 as the electromagnetic shielding plate for protecting the driving circuit section 5 and control section 6 against switching noise, the smoothing capacitor board 25 is efficiently utilized and it also becomes possible to mount components on both sides of the driving circuit board 18. Moreover, since the size of the driving circuit board 18 is reduced and the driving circuit section 5 and control section 6 are consolidated as an integrated circuit structure, the functionality may be increased.

Also, in an alternator structured as above, the smoothing capacitor mounting member 26 is provided at the electrode portion of the large ceramic smoothing capacitor. Therefore, the thermal stress generated due to the difference between the coefficients of thermal expansion of the component and board is absorbed by the lead portion 26a of the smoothing capacitor mounting member 26, and there is little possibility that cracking will develop at the joint to cause contact failure and reliability is increased.

Moreover, since the electrode of the smoothing capacitor 7 and the conductive pattern on the smoothing capacitor board 25 connected to a negative electrode (N) DC input wiring 10n are connected with the smoothing capacitor fixing member 27 and screws 22, the smoothing capacitor fixing member 27 and screws 22 are efficiently used.

According to one aspect of the present invention there is provided an alternator for converting direct current to alternating current equipped with: a switching power module having a switching elements for converting power by switching, a driving circuit section for driving the switching element and a resin case for housing the switching element; a smoothing capacitor for smoothing power output of a DC power source supplied to the switching element; a control circuit section for outputting a control signal to the driving circuit section for control operation of the switching element; and a cooling member for cooling the switching element, wherein, a ceramic capacitor is used as the smoothing capacitor and a smoothing capacitor board for mounting the smoothing capacitor is provided in the switching power module between an insulating board for mounting the switching element and a driving circuit board for mounting the driving circuit section, and the smoothing capacitor board functions also as an electromagnetic shielding plate for protecting the driving circuit section against switching noise from the switching element. Thus, it is possible to reduce the size of the smoothing capacitor because the ceramic capacitor is used as the smoothing capacitor and the smoothing capacitor is also loaded in the switching power module. Furthermore, by using the smoothing capacitor board for mounting the smoothing capacitor as the electromagnetic shielding plate for protecting the driving circuit section and control section against switching noise, the smoothing capacitor board is efficiently utilized and it also becomes possible to mount components on both sides of the driving circuit board, the size of the driving circuit may be reduced and the driving circuit section and control circuit section may be consolidated as an integrated circuit structure so that the alternator may have a reduced size and high functionality.

Moreover, the smoothing capacitor and smoothing capacitor board are electrically connected via a smoothing capacitor mounting member having a flexible lead portion. Thus, the thermal stress generated due to the difference between the coefficients of thermal expansion of the smoothing capacitor and smoothing capacitor board is absorbed by the flexible lead portion, and hence there is very little possibility that cracking will develop at the joint portion of the smoothing capacitor and smoothing capacitor board to cause contact failure.

Further, the smoothing capacitor is fixed to the smoothing capacitor board by means of a smoothing capacitor fixing member made of a material with good heat conducting properties. Therefore, the smoothing capacitor fixing member vents heat generated by the smoothing capacitor to the smoothing capacitor board-side, and the reliability of the alternator is improved.

What is claimed is:

1. An alternator for converting direct current to alternating current comprising:
    a switching power module having a switching elements for converting power by switching, a driving circuit section for driving the switching element and a resin case for housing the switching element;
    a smoothing capacitor for smoothing power output of a DC power source supplied to the switching element;
    a control circuit section for outputting a control signal to the driving circuit section for control operation of the switching element;
    and a cooling member for cooling the switching element, wherein,
    a ceramic capacitor is used as the smoothing capacitor and a smoothing capacitor board for mounting the smoothing capacitor is provided in the switching power module between an insulating board for mounting the switching element and a driving circuit board for mounting the driving circuit section, and the smoothing capacitor board functions also as an electromagnetic shielding plate for protecting the driving circuit section against switching noise from the switching element.

2. An alternator according to claim 1 characterized in that, the smoothing capacitor and smoothing capacitor board are electrically connected via a smoothing capacitor mounting member having a flexible lead portion.

3. An alternator according to claim 1 characterized in that, the smoothing capacitor is fixed to the smoothing capacitor board by means of a smoothing capacitor fixing member made of a material with good heat conducting properties.

* * * * *